(12) United States Patent
Ban et al.

(10) Patent No.: US 7,439,588 B2
(45) Date of Patent: Oct. 21, 2008

(54) TRI-GATE INTEGRATION WITH EMBEDDED FLOATING BODY MEMORY CELL USING A HIGH-K DUAL METAL GATE

(75) Inventors: Ibrahim Ban, Beaverton, OR (US); Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 232 days.

(21) Appl. No.: 11/302,747

(22) Filed: Dec. 13, 2005

(65) Prior Publication Data

US 2007/0131983 A1    Jun. 14, 2007

(51) Int. Cl.
*H01L 27/01* (2006.01)

(52) U.S. Cl. .................................... 257/351; 257/369

(58) Field of Classification Search ................. 257/350, 257/351, 369
See application file for complete search history.

(56) References Cited

U.S. PATENT DOCUMENTS

| | | | |
|---|---|---|---|
| 5,804,848 | A | 9/1998 | Mukai |
| 5,844,278 | A | 12/1998 | Mizuno et al. |
| 5,899,710 | A | 5/1999 | Mukai |
| 6,018,176 | A | 1/2000 | Lim |
| 6,066,869 | A | 5/2000 | Noble et al. |
| 6,413,802 | B1 | 7/2002 | Hu et al. |
| 6,459,123 | B1 | 10/2002 | Enders et al. |
| 6,472,258 | B1 | 10/2002 | Adkisson et al. |
| 6,525,403 | B2 | 2/2003 | Inaba et al. |
| 6,562,665 | B1 | 5/2003 | Yu |
| 6,583,469 | B1 | 6/2003 | Fried et al. |
| 6,611,029 | B1 | 8/2003 | Ahmed et al. |
| 6,630,388 | B2 | 10/2003 | Sekigawa et al. |
| 6,635,909 | B2 | 10/2003 | Clark et al. |
| 6,642,090 | B1 | 11/2003 | Fried et al. |
| 6,657,259 | B2 | 12/2003 | Fried et al. |
| 6,689,650 | B2 | 2/2004 | Gambino et al. |
| 6,770,516 | B2 | 8/2004 | Wu et al. |
| 6,787,402 | B1 | 9/2004 | Yu |
| 6,794,718 | B2 | 9/2004 | Nowak et al. |

(Continued)

OTHER PUBLICATIONS

Yang-Kyu Choi, et al., "Sub-20nm CMOS FinFET Technologies", 2001 IEEE, 0-7803-7050-3/01 (pp. 19.1.1-19.1.4), Dec. 2001.

(Continued)

*Primary Examiner*—Mark Prenty
(74) *Attorney, Agent, or Firm*—Blakely, Sokoloff, Taylor & Zafman LLP

(57) ABSTRACT

Dual-gate memory cells and tri-gate CMOS devices are integrated on a common substrate. A plurality of silicon bodies are formed from a monocrystalline silicon on the substrate to define a plurality of transistors including dual-gate memory cells, PMOS transistors, and NMOS transistors. An insulative layer is formed overlying the silicon body of the memory cell. A layer of a high-k dielectric and at least a metal layer cover the silicon bodies and their overlying layers. Next, gain regions of the transistors are filled with polysilicon. Thus, a gate is formed on the top surface and both sidewalls of a tri-gate transistor. Thereafter, the high-k dielectric and the metal layer overlying the insulative layer of the memory cell are removed to expose the insulative layer. Thus, two electrically-isolated gates of the memory cell are formed.

8 Claims, 7 Drawing Sheets

U.S. PATENT DOCUMENTS

| | | |
|---|---|---|
| 6,798,000 B2 | 9/2004 | Luyken et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 7,023,064 B2 * | 4/2006 | Park et al. ................... 257/412 |
| 7,037,790 B2 * | 5/2006 | Chang et al. ................ 438/275 |
| 2006/0071299 A1 | 4/2006 | Doyle et al. |
| 2007/0228437 A1 * | 10/2007 | Forbes ....................... 257/296 |

OTHER PUBLICATIONS

Jong-Tae Park, et al., "Pi-Gate SOI MOSFET", IEEE Electron Device Letters, vol. 22, No. 8, Aug. 2001, 0741-3106/01 (pp. 405-406).

* cited by examiner (Optional)

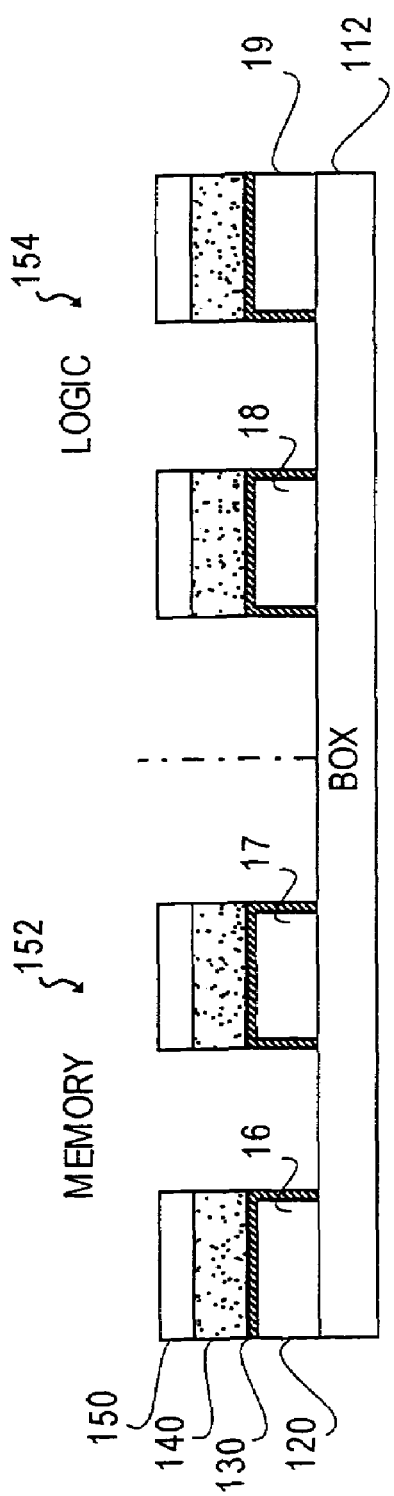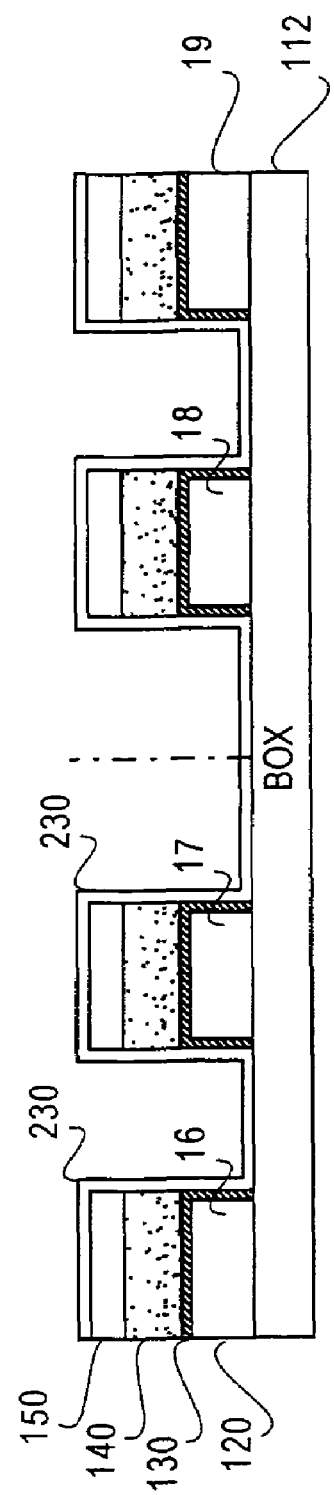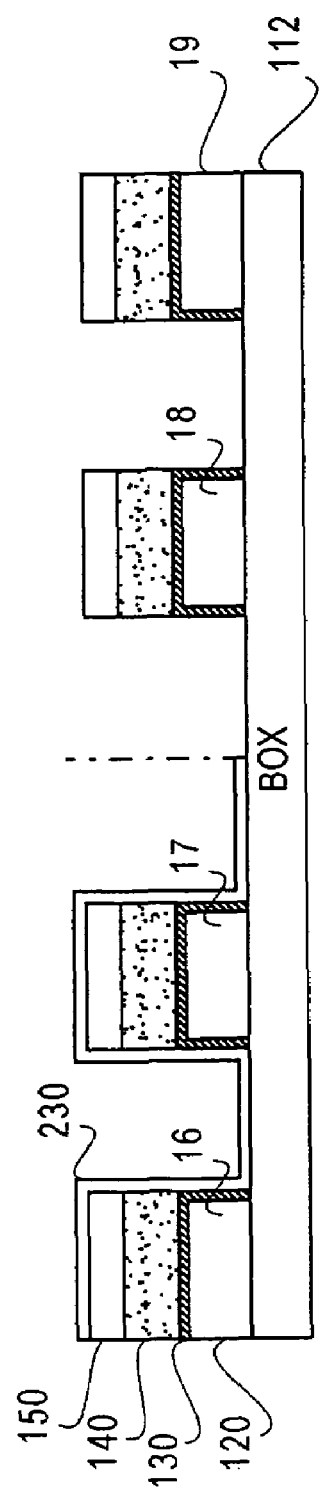

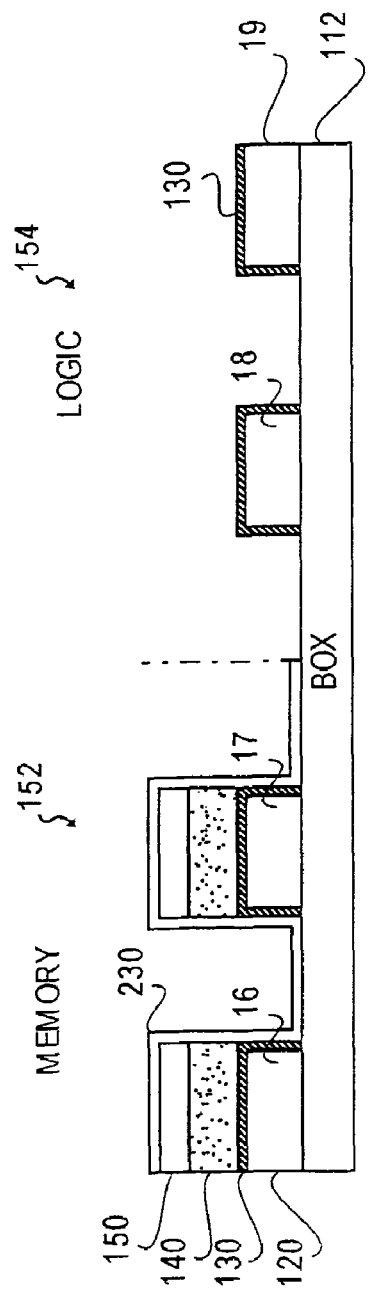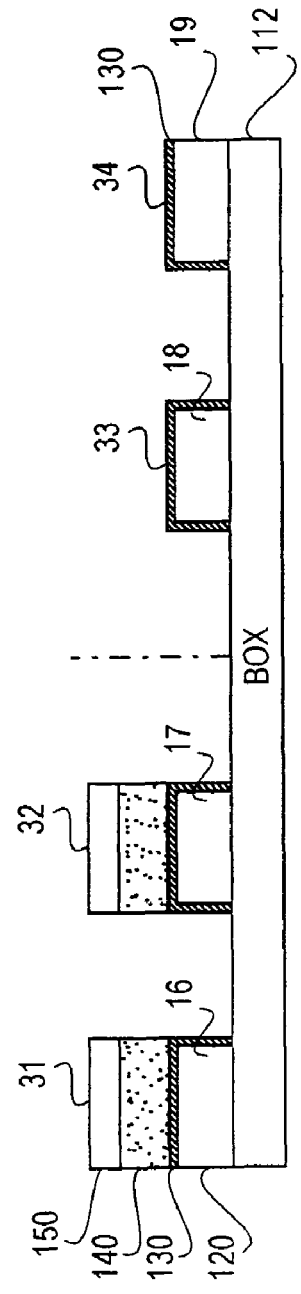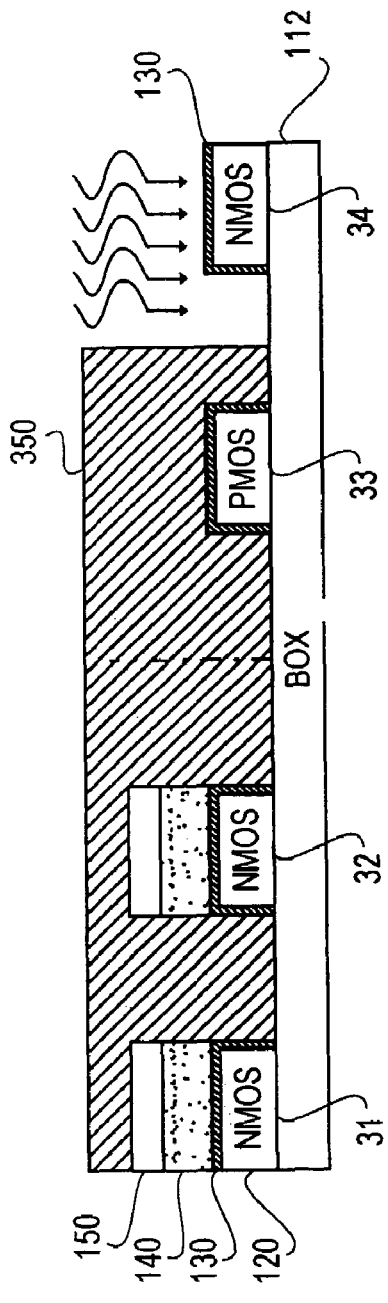
FIG. 3A
FIG. 3B
FIG. 3C

TRI-GATE INTEGRATION WITH EMBEDDED FLOATING BODY MEMORY CELL USING A HIGH-K DUAL METAL GATE

BACKGROUND

1. Field of the Invention

Embodiments relate to semiconductor integrated circuit fabrication.

2. Background

A recent development in semiconductor processing is the tri-gate transistor. A tri-gate transistor includes a thin semiconductor body formed on a substrate. A gate dielectric is formed on the top surface and the sidewalls of the semiconductor body. A gate electrode is formed on the surface of the gate dielectric on the top surface and the sidewalls of the semiconductor body. Source and drain regions are formed in the semiconductor body on opposite sides of the gate electrode. Because the gate electrode and the gate dielectric surround the semiconductor body on three sides, the transistor essentially has three separate gates. These three separate gates provide three separate channels for electrical signals to travel, thus effectively tripling the conductivity as compared to a conventional planar transistor.

Another recent development in semiconductor processing is the one-transistor (1-T) floating body cell (FBC), which may be used in an embedded memory. Conventional dynamic random access memory (DRAM) requires a transistor and a separator capacitor to implement a memory cell. The 1-T FBC stores a signal charge inside a floating body region, which modulates the threshold voltage of the transistor. As a result, the separate capacitor of the DRAM memory cell can be eliminated, thereby resulting in reduced cell area and higher density.

The 1-T FBC may be further optimized by a dual-gate structure. A dual-gate memory cell has two gates disposed on opposite sides of a silicon body, each gate being independently controlled. A gate dielectric is formed on two sides of the silicon body. Two gates are formed on the surface of the gate dielectric, one on each side of the silicon body. An insulating layer electrically isolates the gates from the top of silicon body. Because the dual gate device has a gate on each side of the channel, thickness of the silicon body can be double that of a single gate device and still obtain a fully depleted transistor operation.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIG. 2A illustrates oxidizing the sidewalls of the silicon bodies.

FIG. 2B illustrates forming a blanket layer of silicon.

FIG. 2C illustrates removing the blanket layer of silicon from the logic area.

FIG. 3A illustrates removing the overlying layers of the silicon bodies in the logic area FIG. 3B illustrates removing the blanket layer of silicon from the memory area.

FIG. 3C illustrates well lithography and implant of the silicon bodies in the logic area.

DETAILED DESCRIPTION

The method which follows describes the formation of both dual-gate floating body cell (FBC) transistors and complementary metal-oxide semiconductor (CMOS) tri-gate transistors in a single process flow. Although the fabrication of only two dual-gate transistors and two tri-gate transistors are illustrated, it is understood that in a typical integrated circuit, numerous such transistors may be simultaneously fabricated.

Figure 1A:
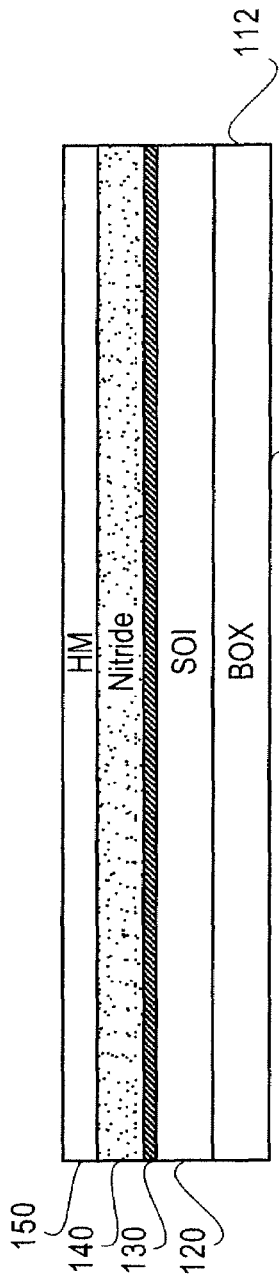
FIG. 1A is a cross-sectional view of a plurality of material layers used to form dual-gate transistors and tri-gate transistors.
Figure 1B:
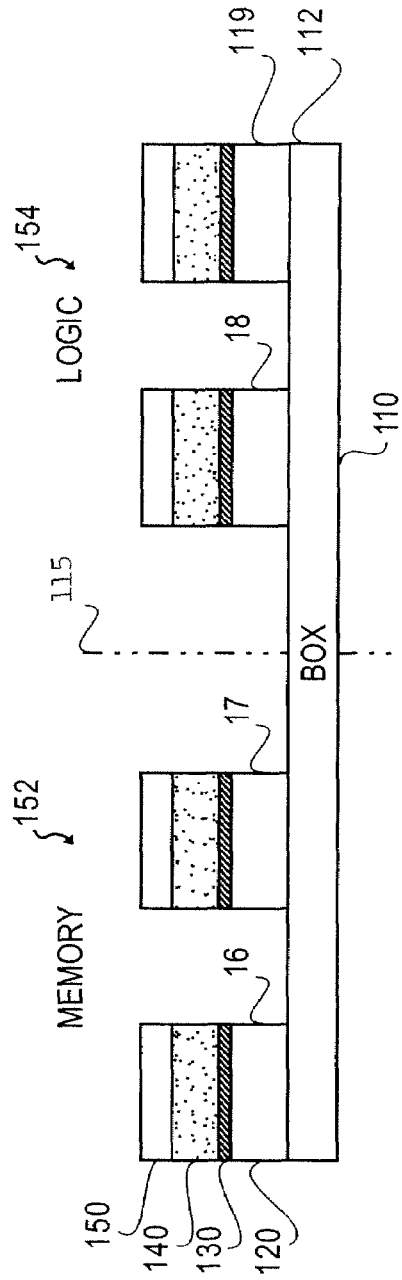
FIG. 1B is a cross-sectional view of four silicon bodies with overlying layers on a substrate, wherein the two silicon bodies to the left of the centerline (the memory area) are to form dual-gate memory cells and the two silicon bodies to the right (the logic area) are to form tri-gate transistors.

FIG. 1B is a cross-sectional view of four silicon bodies 16, 17, 18, and 19 with overlying layers on a substrate 110. A dotted centerline 115 is shown to mark the boundary of a memory area 152 and a logic area 154. Silicon bodies 16 and 17 which are located at the left of centerline 115 are used to form dual-gate floating body cell (FBC) n-type MOS (NMOS) transistors. Silicon bodies 18 and 19 which are located at the right of centerline 115 are used to form tri-gate CMOS devices including at least one NMOS transistor and a p-type MOS (PMOS) transistor. Although each of the silicon bodies as shown is designated to form a particular type of MOS transistor, it is understood that the type of MOS may be arbitrarily changed to suit a particular design requirement without altering the fabrication process to be described below.

In one embodiment, substrate 110 is a silicon-on-insulator (SOI) substrate. The technique of forming a SOI substrate is well-known in the art. For example, substrate 110 may include a buried oxide layer (BOX 112) on top of a silicon substrate (not shown). BOX 112 may be a subsurface layer of silicon dioxide (SiO2) created through ion implantation of high dose of oxygen into the silicon substrate. In the cross-sectional views, the transistors are shown fabricated on BOX 112; the underlying silicon substrate is not shown.

FIG. 1A is a cross-sectional view of the layers of materials used to form silicon bodies 16, 17, 18, and 19 and the layers on top of the silicon bodies. On the top surface of BOX 112, four layers of materials are deposited or grown to form a vertical stack. The four layers, from bottom to top, are a mono-crystalline silicon layer 120, a pad ox layer 130 (e.g., SiO2), a nitride layer 140 (e.g., Si3N4), and a hard mask (HM) layer 150 (e.g., an anti-reflective oxy-nitride layer). Pad ox 130 is a thin, thermally grown layer of oxide which may serve as a protective etch stop layer in the subsequent etch processes. Nitride layer 140 is superjacent to pad ox 130, meaning that there are no intervening layers between them. Nitride layer 140 may serve as an insulative layer in the subsequent process of forming the transistors. Standard lithography and etching may be applied to remove the portions of the layers that are not shown in FIG. 1B. For example, a photoresist pattern may be placed on top of hard mark 150 to define the areas to be removed. After exposing the photoresist to ultraviolet light, a series of etching process may be performed to remove the exposed areas of hard mask 150 and nitride layer 140. An ashing process strips the photoresist, followed by a silicon etch to expose BOX layer 112 between silicon bodies 16-19. As a result, four isolated stacks remain on top of BOX layer 112. Each stack includes one of silicon bodies 16-19 which will form active elements of the transistors.

Figure 1C:
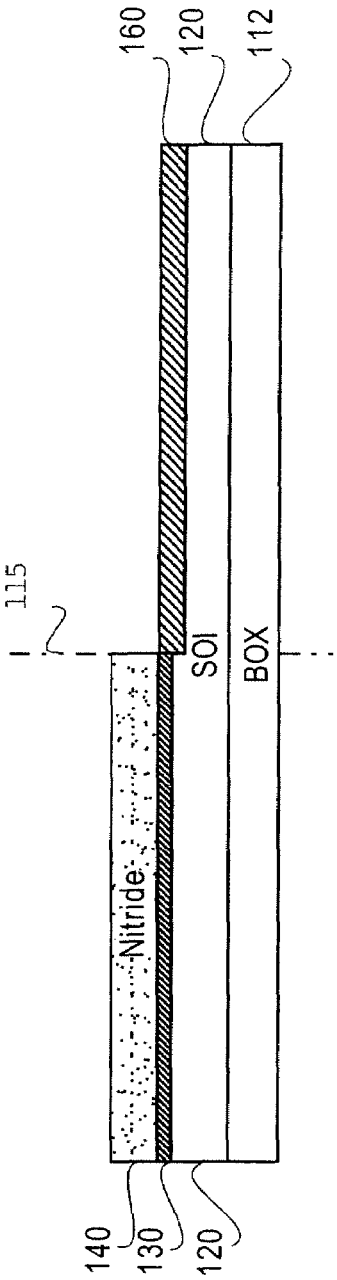
FIG. 1C shows an optional process of thinning a silicon layer in the logic area before the silicon bodies of FIG. 1B are formed.

FIG. 1C shows an optional process for thinning silicon layer 120 in logic area 154. After depositing pad ox 130 and nitride layer 140 but before forming hard mask 150, logic area 154 is opened. Nitride layer 140 is selectively etched with a dry chemistry, followed by wet etch of the remaining oxide 130. Then, a thick oxide layer 160 may be grown and etched back to give the desired thickness of silicon 120. Thereafter, nitride 140 and oxide 130 may be stripped off from memory area 152 to produce two different levels of silicon 120 thickness in memory area 152 and logic area 154. After the silicon thinning, pad ox 130 and nitride layer 140 are deposited in logic area 154, followed by hard mask 150 formation over memory 152 and logic 154 areas, to continue the process of FIG. 1B. Alternatively, memory area 152 may be masked to implant species such as nitrogen. As nitrogen changes the oxidation rate, silicon layer 120 in logic area 154 may be more easily thinned. This can be done with lithography, implant, oxidation, and etch.

Referring to FIG. 2A, the sidewalls of silicon bodies 16-19 are oxidized to isolate the silicon from the following etching process. A thin blanket layer of silicon 230 is deposited to cover the entire area including the four stacks and the exposed areas of BOX 112 (FIG. 2B). Subsequently, the blanket layer of silicon 230 is removed from logic area 154 by lithography and wet or dry etch (FIG. 2C).

Referring to FIG. 3A, hard mask 150 and nitride layer 140 are removed from logic area 154 as these layers are not needed for a CMOS device. Hard mask 150 and nitride layer 140 may be removed in one step using wet etch. The etchant may be selective to silicon, which means it removes nitride-based materials while keeping silicon intact. Thus, silicon layer 230 protects the layers in memory area 152 from the wet etch process. Next, in FIG. 3B, silicon layer 230 may be cleaned from memory area 152 by another wet etch. At this point, conventional process of well lithography and implantation may be performed to any of transistors 31, 32, 33, and 34. As different dopants are applied to PMOS and NMOS transistors, a photoresist 350 may be deposited over the transistors not intended to receive a particular dopant. For example, in FIG. 3C, photoresist 350 is deposited over transistors 31, 32, and 33 to protect these devices from the ion implantation of NMOS transistor 34.

Figure 4A:
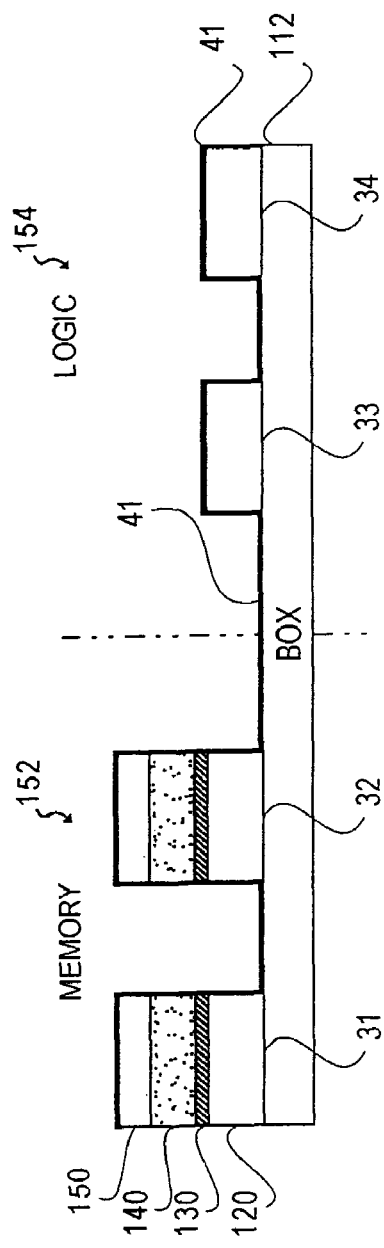
FIG. 4A illustrates depositing a blanket layer of high-K dielectric layer.
Figure 4B:
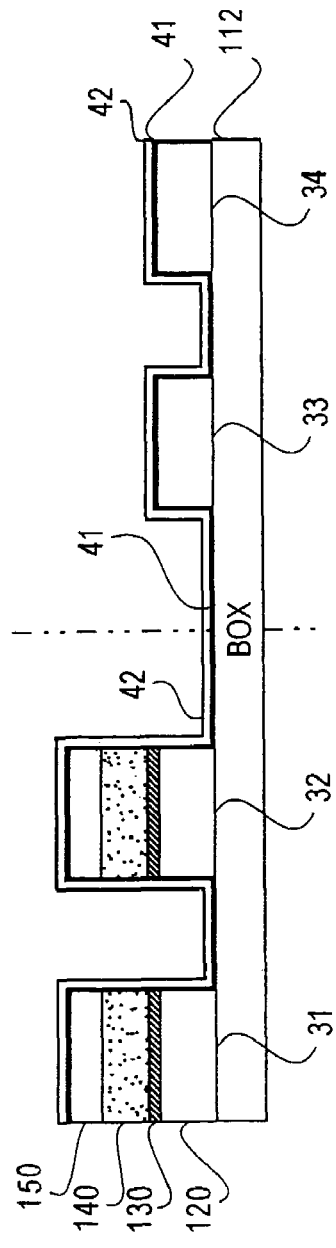
FIG. 4B illustrates depositing a blanket layer of a PMOS metal layer.
Figure 4C:
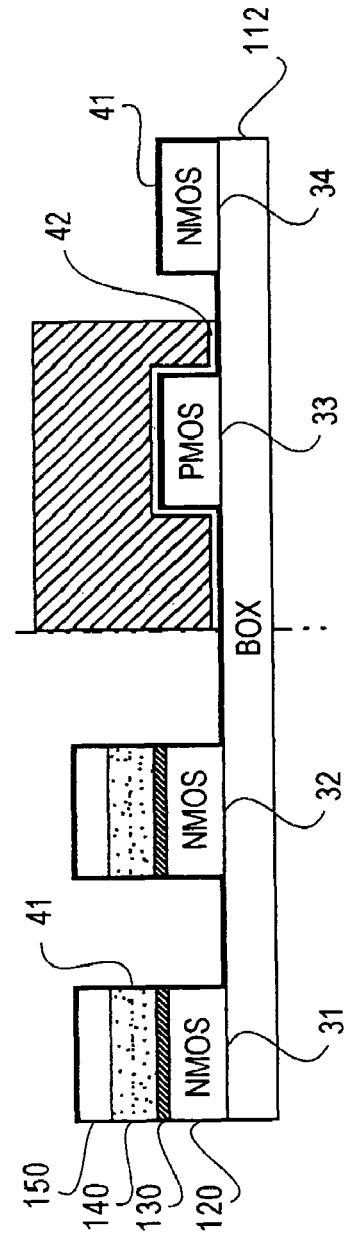
FIG. 4C illustrates removing the PMOS metal layer from NMOS transistors.

Referring to FIG. 4A, photoresist 350 is stripped by ashing, followed by removal of the oxidized silicon on the sidewalls of silicon bodies 16-19 by dry or wet etch. A sacrificial oxide layer (not shown) may be grown and then removed to pre-clean the gate regions of transistors 31-34. Here, the gate regions refer to the space between any two adjacent transistors 31-34. Next, a blanket layer of high-k gate dielectric layer 41, e.g., Hafnium Oxide (HfO2), may be deposited over transistors 31-34 and the exposed areas of BOX 112. High-k dielectric layer 41 may be capped with an appropriate PMOS gate metal 42 (FIG. 4B). PMOS gate metal 42 may be etched away from NMOS transistors 31, 32, and 34 with a combination of lithography and wet etch (FIG. 4C). This metal etch is very selective to high-k dielectric 41 to prevent damage to dielectric 41.

Figure 5A:
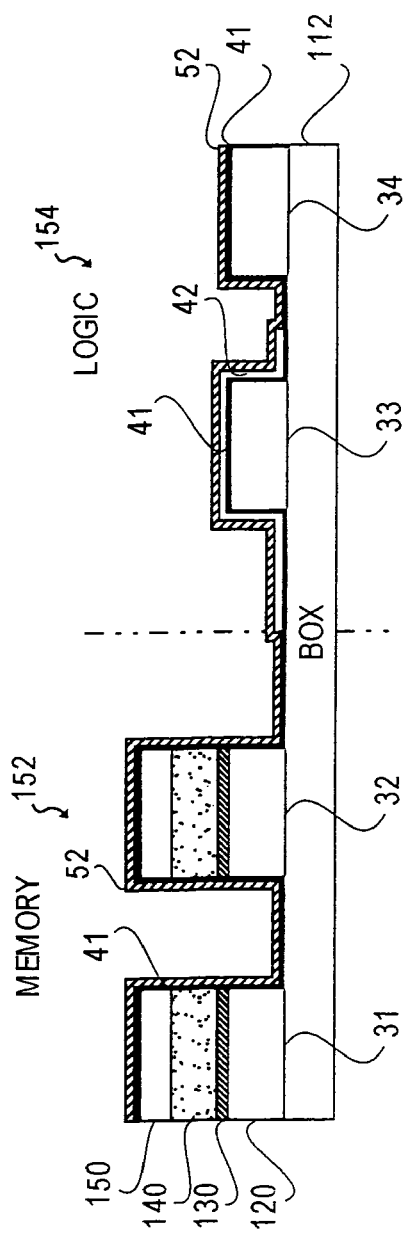
FIG. 5A illustrates depositing a blanket layer of a NMOS metal layer.

Referring to FIG. 5A, following ashing and cleaning, a blanket of a second metal 52, different from PMOS gate metal 42, is deposited over transistors 31-34 and the exposed portion of BOX 112. Thus, NMOS transistors 31, 32, and 34 are capped by a layer of metal 52 with an appropriate work function for the NMOS. Meanwhile, PMOS transistor 33 is capped by bi-layer metal 42 and 52 to ensure that PMOS metal is sufficiently thick to provide the appropriate work function. In an alternative process where a single metal layer is used for both the PMOS and NMOS transistors, the processes shown in FIGS. 4B and 4C may be omitted.

Figure 5B:
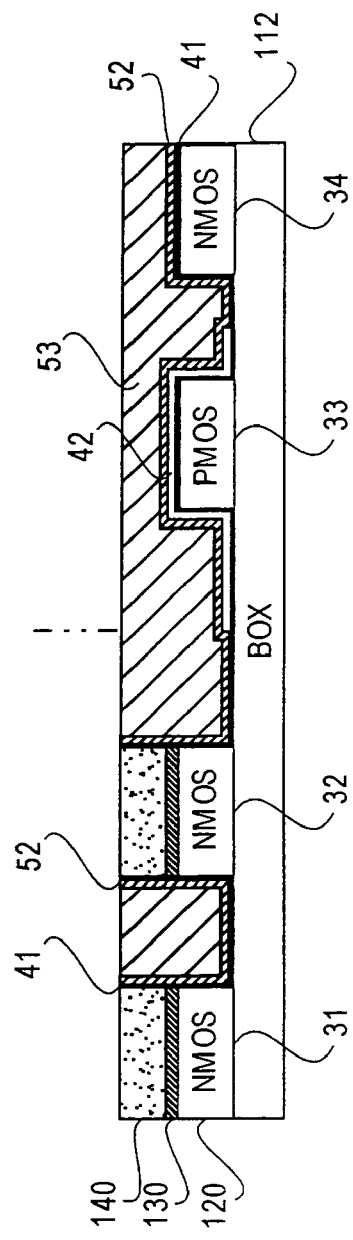
FIG. 5B illustrates depositing polysilicon, and polishing it in gain regions of the transistors.

Referring to FIG. 5B, a layer of polysilicon 53 is deposited over the entire area, including the top surface of transistors 31-34 and the gain regions between the transistors. The top portions of the entire area is planarized, e.g., using chemical mechanical polishing (CMP) techniques. The CMP is continued until nitride layer 140 on transistor 31 and 32 is exposed. As polish rate is dependent on the density of the underlying structures, polish rate is expected to be higher in the low-density logic area. A simple solution to this uneven polish rate may be to use FBC dummies in logic area 154. For example, a number of inactive dual-gate memory cells may be fabricated in logic area 154 interspersed among the CMOS devices to increase the density of logic area 154.

Figure 5C:
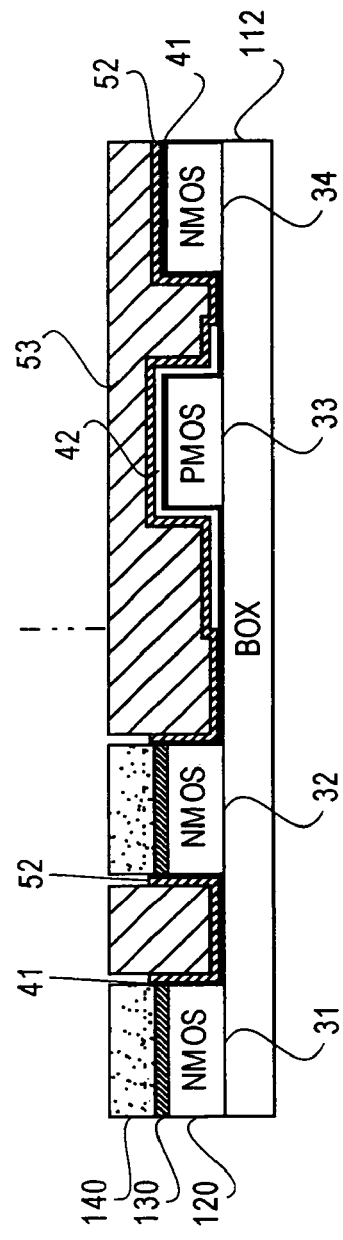
FIG. 5C illustrate an optional wet etch process to clean the high-K dielectric layer and metal slivers in the memory area.
Figures 5D, 6A, 6B:
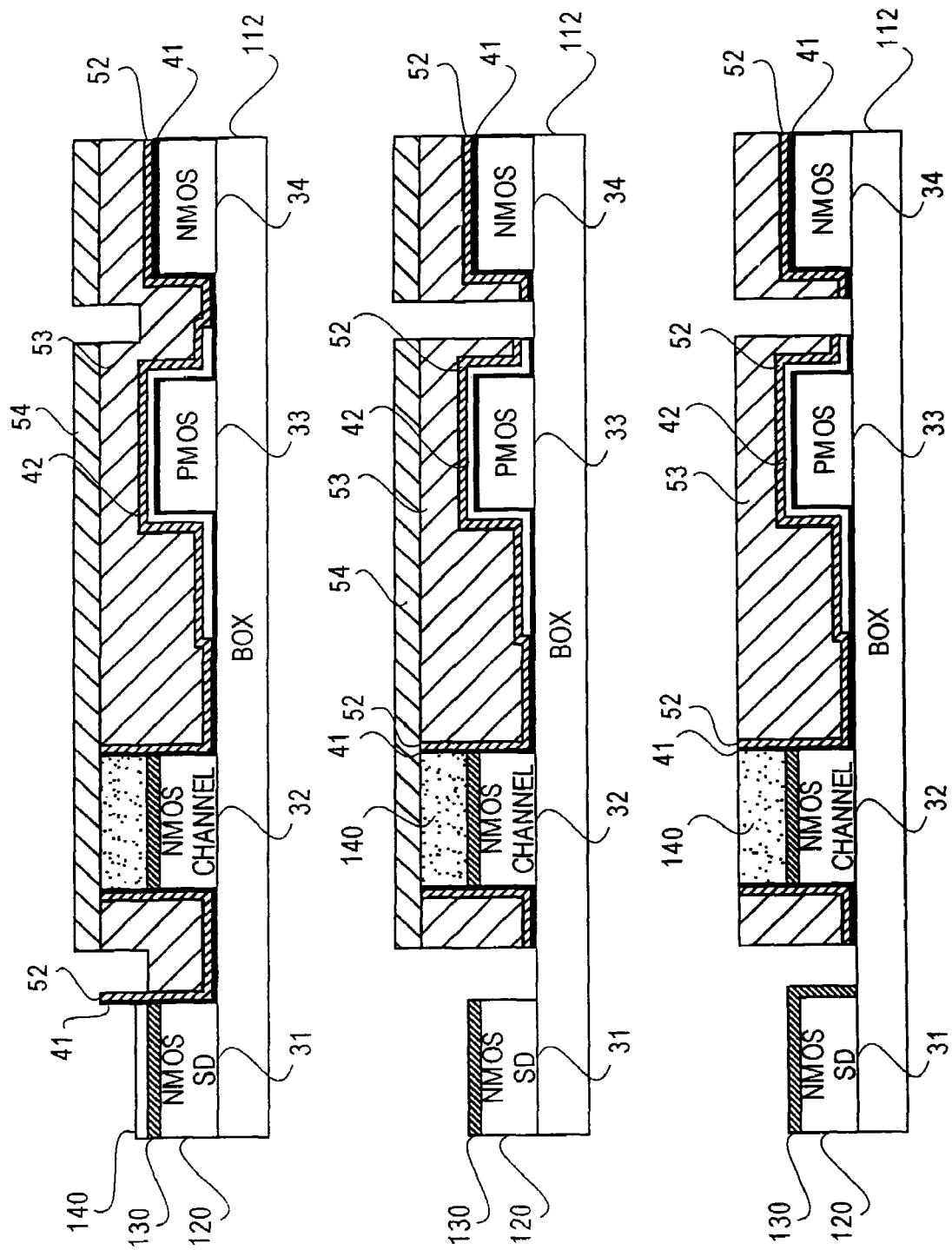
FIG. 5D illustrates forming a hard mask on the polysilicon and removing an insulative layer from a NMOS transistor in the memory area to form a source/drain region.
FIG. 6A illustrates vertical etching of the polysilicon, metal, and high-K dielectric layer.
FIG. 6B illustrates the process of chemical oxidation and removal of the hard mask.

Referring to FIG. 5D, a layer of hard mask 54 is deposited over the planarized surface. A combination of lithography and etch is used to pattern polysilicon 53 and to expose source/drain (SD) regions of both memory and logic transistors 31-34. First, hard mask 54 is etched until some portion, e.g., 10-20%, of nitride 140 on the source/drain of memory cells (NMOS transistors 31 and 32) is left. During the etching process, the exposed portion of polysilicon 53 is also etched but the exposed portion of metal layer 52 remains intact. Next, photoresist used in the lithography is removed by ashing. Hard mask 54 is now used as a mask for the subsequent patterning process. At this point, it can be recognized that the cross-section view of FIG. 5D shows the source/drain area of NMOS transistor 31 and the channel area of NMOS transistor 32.

FIG. 5C shows an optional process for eliminating potential problems caused by particles created during the polysilicon 53 patterning in FIG. 5D. Due to differential etch rates of polysilicon/nitride etch chemistries on high-k and metals, high-K dielectric 41 and metal slivers may form after the polysilicon 53 patterning. Thus, a wet etchant that attacks high-k dielectric 41 and metal 52 but keeps nitride 140 and polysilicon 53 intact may be used to etch away the excess portion of metal 52 in FIG. 5D to eliminate the slivers. The excess portion of metal 52 may be the piece of metal 52 that sticks up above the surface of nitride layer 140. The process of FIG. 5C may be performed after the CMP process of FIG. 5B is completed.

Referring to FIG. 6A, polysilicon 53 is further patterned by etch. Depending on the selectivity of the etch chemistry, some or all of nitride 140 on the source/drain of memory transistors 31 and 32 may be eroded in the process. If there is any remaining nitride 140, a selective etch may be applied to ensure that all of the exposed nitride 140 is etched away. As a result, pad ox 130 on the source/drain of memory transistors 31 and 32 is exposed. A further etch process may be applied to metal 52 and high-K dielectric 41 to clean up the residues on the exposed surfaces.

Referring to FIG. 6B, the exposed sidewalls of silicon body 16 is oxidized by chemical oxidation to serve as an etch stop. The oxidization protects silicon body 16 from the hot phosphoric acid used for the subsequent removal process of hard mask 54. Following the oxidization, hard mask 54 may be finally removed.

In an alternative embodiment, the above chemical oxidation of silicon body 16 may be avoided. Instead of removing high-K dielectric 41 in the process of FIG. 6A, high-K dielectric 41 may be kept until after hard mask 54 is removed to avoid silicon pitting caused by the hot phosphoric acid.

At this point, lithography may be performed for tip implants. Conventional processes, e.g., spacer formation, source/drain implants, activation annealing, silicide formation, contact formation, and metal interconnection may be performed. Thus, dual-gate transistors 31 and 32, a tri-gate PMOS transistor 33, a tri-gate NMOS transistor 34 have been fabricated on a common substrate.

Figure 7:
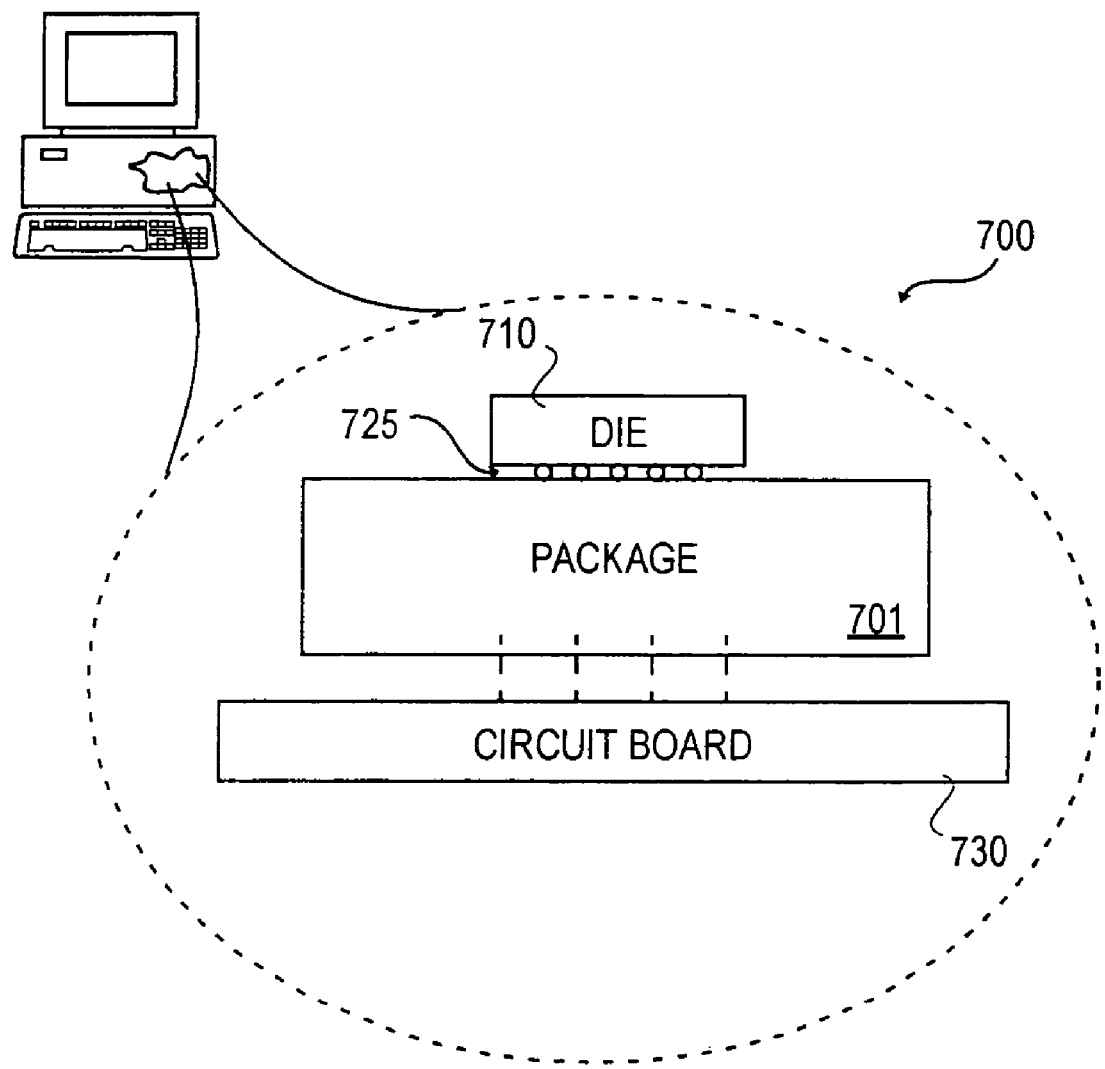
FIG. 7 is a cross-sectional view of an integrated circuit package comprising dual-gate transistors and tri-gate transistors.

FIG. 7 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanners, monitors, etc.), entertainment device (e.g., television, radio, stereo, tape and compact disc player, videocassette recorder, MP3 (Motion Picture Experts Group, Audio Layer 3) player, etc.), and the like. FIG. 7 illustrates the package as part of a desktop computer.

FIG. 7 shows electronic assembly 700 including die 710 physically and electrically connected to package substrate 701. Die 710 is an integrated circuit die, such as a processor die. In one embodiment, die 710 includes dual-gate transistors and tri-gate transistors. Electrical contact points (e.g., contact pads on a surface of die 710) are connected to package substrate 701 through conductive bump layer 725. Package substrate 701 may be used to connect electronic assembly 700 to printed circuit board 730, such as a motherboard or other circuit board.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. An apparatus comprising:
 a substrate;
 a dual-gate transistor on the substrate;
 a tri-gate NMOS transistor on the substrate; and
 a tri-gate PMOS transistor on the substrate,
 wherein each of the dual-gate transistor, the tri-gate NMOS transistor, and the tri-gate PMOS transistor includes a silicon body, and the silicon body of each of the tri-gate transistors is thinner than the silicon body of the dual-gate transistor.

2. The apparatus of claim 1 wherein the silicon body of each of the dual-gate transistor, the tri-gate NMOS transistor, and the tri-gate PMOS transistor comprises a monocrystalline silicon.

3. The apparatus of claim 1 wherein the dual-gate transistor comprises an oxide layer on the silicon body and a nitride layer on top of the oxide layer.

4. The apparatus of claim 1 wherein the tri-gate NMOS transistor comprises a first metal layer different from a second metal layer of the PMOS transistor.

5. A system comprising:
 a computing device comprising a microprocessor comprising a plurality of circuit devices on a substrate, each of the plurality of circuit devices comprising:
 a substrate;
 a dual-gate transistor on the substrate;
 a tri-gate NMOS transistor on the substrate; and
 a tri-gate PMOS transistor on the substrate,
 wherein each of the dual-gate transistor, the tri-gate NMOS transistor, and the tri-gate PMOS transistor includes a silicon body, and the silicon body of each of the tri-gate transistors is thinner than the silicon body of the dual-gate transistor.

6. The system of claim 5 wherein the silicon body of each of the dual-gate transistor, the tri-gate NMOS transistor, and the tri-gate PMOS transistor comprises a monocrystalline silicon.

7. The system of claim 5 further comprising:
 inactive dual-gate transistors interspersed among a plurality of the tri-gate transistors.

8. The system of claim 6 wherein tri-gate NMOS transistor comprises a first metal layer different from a second metal layer of the PMOS transistor.

* * * * *